United States Patent
Bratkovski et al.

(10) Patent No.: US 9,171,613 B2
(45) Date of Patent: Oct. 27, 2015

(54) MEMRISTORS WITH ASYMMETRIC ELECTRODES

(75) Inventors: Alexandre M. Bratkovski, Mountain View, CA (US); Jianhua Yang, Palo Alto, CA (US); Shih-Yuan Wang, Palo Alto, CA (US); Michael Stuke, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 510 days.

(21) Appl. No.: 13/322,291

(22) PCT Filed: Jul. 28, 2009

(86) PCT No.: PCT/US2009/051936
§ 371 (c)(1),
(2), (4) Date: Nov. 23, 2011

(87) PCT Pub. No.: WO2011/016794
PCT Pub. Date: Feb. 10, 2011

(65) Prior Publication Data
US 2012/0132880 A1    May 31, 2012

(51) Int. Cl.
*H01L 29/04* (2006.01)
*H01L 47/00* (2006.01)
*G11C 13/00* (2006.01)
(Continued)

(52) U.S. Cl.
CPC ............ *G11C 13/0007* (2013.01); *G11C 16/02* (2013.01); *H01L 27/2463* (2013.01); *H01L 45/08* (2013.01); *H01L 45/1233* (2013.01); *H01L 45/1273* (2013.01); *H01L 45/146* (2013.01); *H01L 45/147* (2013.01); *H01L 45/148* (2013.01); *G11C 2213/19* (2013.01); *G11C 2213/52* (2013.01)

(58) Field of Classification Search
CPC ............ H01L 45/146; H01L 45/1233; H01L 27/2463; H01L 45/1273; H01L 45/08; G11C 2213/19; G11C 2213/52; G11C 13/0007; G11C 16/02
USPC .................. 257/2, 3, 4, E27.006, E29.326, 257/E29.325, E45.002
See application file for complete search history.

(56) References Cited

U.S. PATENT DOCUMENTS

| 6,927,074 B2 * | 8/2005 | Hsu et al. ............... 438/3 |
| 7,257,016 B2 * | 8/2007 | Snider .................. 365/151 |

(Continued)

OTHER PUBLICATIONS

International Search Report, dated Aug. 23, 2011; PCT Application No. PCT/US2009/051936, filed Jul. 28, 2009.

*Primary Examiner* — William F Kraig
*Assistant Examiner* — Latanya N Crawford
(74) *Attorney, Agent, or Firm* — Olympic Patent Works PLLC (57) ABSTRACT

Embodiments of the present invention are directed to nanoscale memristor devices that provide nonvolatile memristive switching. In one embodiment, a memristor device includes an active region, a first electrode disposed on a first surface of the active region, and a second electrode disposed on a second surface of the active region, the second surface opposite the first surface. The first electrode is configured with a smaller width than the active region in a first direction, and the second electrode is configured with a larger width than the active region in a second direction. Application of a voltage to at least one of the electrodes produces an electric field across a sub-region within the active region between the first electrode and the second electrode.

19 Claims, 8 Drawing Sheets (51) Int. Cl.
  *G11C 16/02* (2006.01)
  *H01L 45/00* (2006.01)
  *H01L 27/24* (2006.01)

(56) References Cited

U.S. PATENT DOCUMENTS

| | | | |
|---|---|---|---|
| 8,502,188 B2* | 8/2013 | Pickett et al. | 257/5 |
| 2004/0233708 A1* | 11/2004 | Hsu et al. | 365/158 |
| 2005/0040482 A1* | 2/2005 | Suzuki et al. | 257/411 |
| 2005/0145910 A1* | 7/2005 | Tamai et al. | 257/296 |
| 2005/0243630 A1* | 11/2005 | Hsu et al. | 365/222 |
| 2006/0060832 A1* | 3/2006 | Symanczyk et al. | 257/3 |
| 2006/0128129 A1 | 6/2006 | Stasiak et al. | |
| 2007/0008773 A1* | 1/2007 | Scheuerlein | 365/161 |
| 2007/0045704 A1* | 3/2007 | Ufert | 257/314 |
| 2007/0090444 A1* | 4/2007 | Park et al. | 257/314 |
| 2007/0117256 A1 | 5/2007 | Stewart et al. | |
| 2007/0272950 A1* | 11/2007 | Kim et al. | 257/211 |
| 2008/0061282 A1* | 3/2008 | Sato et al. | 257/4 |
| 2008/0090337 A1 | 4/2008 | Williams | |
| 2008/0100345 A1 | 5/2008 | Bratkovski et al. | |
| 2009/0102597 A1* | 4/2009 | Ishihara | 338/20 |
| 2009/0163826 A1 | 6/2009 | Mouttet | |
| 2009/0184397 A1 | 7/2009 | Gergel-Hackett et al. | |
| 2009/0289371 A1* | 11/2009 | Sakamoto | 257/773 |
| 2010/0264396 A1* | 10/2010 | Lung et al. | 257/3 |
| 2011/0006275 A1* | 1/2011 | Roelofs et al. | 257/2 |
| 2011/0017977 A1* | 1/2011 | Bratkovski et al. | 257/14 |
| 2011/0024716 A1* | 2/2011 | Bratkovski et al. | 257/5 |
| 2011/0227032 A1* | 9/2011 | Xia et al. | 257/5 |
| 2011/0303890 A1* | 12/2011 | Pickett et al. | 257/5 |

* cited by examiner

MEMRISTORS WITH ASYMMETRIC ELECTRODES

TECHNICAL FIELD

Embodiments of the present invention are related to nanoscale memristor devices.

BACKGROUND

Significant research and development efforts are currently directed towards de-signing and manufacturing nanoscale electronic devices, such as nanoscale memories. Nanoscale electronics promises significant advances, including considerably reduced features sizes and the potential for self-assembly and for other relatively inexpensive, non-photolithography-based fabrication methods. However, the design and manufacture of nanoscale electronic devices present many new challenges when compared with the current state-of-the-art.

Studies of switching in nanometer-scale transition-metal oxide devices have previously reported that these devices could be reversibly switched and had an "on-to-off" conductance ratio of approximately $10^4$. These devices have been used to construct crossbar circuits and provide a promising route for the creation of ultra-high density nonvolatile memory. A series connection of crossbar switches that can be used to fabricate, for example, latch circuit elements has also been demonstrated, which is an important component for logic circuits and for communication between logic and memory. New logic families that can be constructed entirely from crossbar arrays of resistive switches or as hybrid structures composed of resistive switches and transistors have been described. These new logic families have the potential to dramatically increase the computing efficiency of CMOS circuits, thereby enabling performance improvements of orders of magnitude without having to shrink transistors, or to even replace CMOS for some applications if necessary. However, it is desired to improve the performance of these devices.

DETAILED DESCRIPTION

Embodiments of the present invention are directed to nanoscale memristor devices that provide nonvolatile memristive switching. The memristor devices comprise an active region composed of a switching material disposed between two electrodes. The electrodes are of different cross-sectional dimensions with the first electrode having a smaller cross-sectional dimension than the active region and the second electrode having a larger cross-sectional dimension than the active region. When voltages of appropriate magnitudes are applied to the electrodes, the dimensions of the electrodes channel the resulting electric field near the center of the active region between the electrodes and away from the outer surfaces of the active region. Embodiments of the present invention also include patterned openings in at least one of the electrodes in order to further concentrate the electric field near the center of the active region between the electrodes. Memristor devices configured in accordance with embodiments of the present invention can be implemented at nanowire intersections of nanowire crossbars.

The detailed description is organized as follows: A description of electronically actuated memristor devices configured in accordance with embodiments of the present invention is provided in a first subsection. Various materials that can be used to fabricate the memristor devices are provided in a second subsection. A description of two possible ways of switching the rectifying state of a memristor device is provided in a third subsection. An example implementation of memristor devices in crossbar arrays is provided in a fourth subsection.

I. An Electronically Actuated Device

Figure 1A:
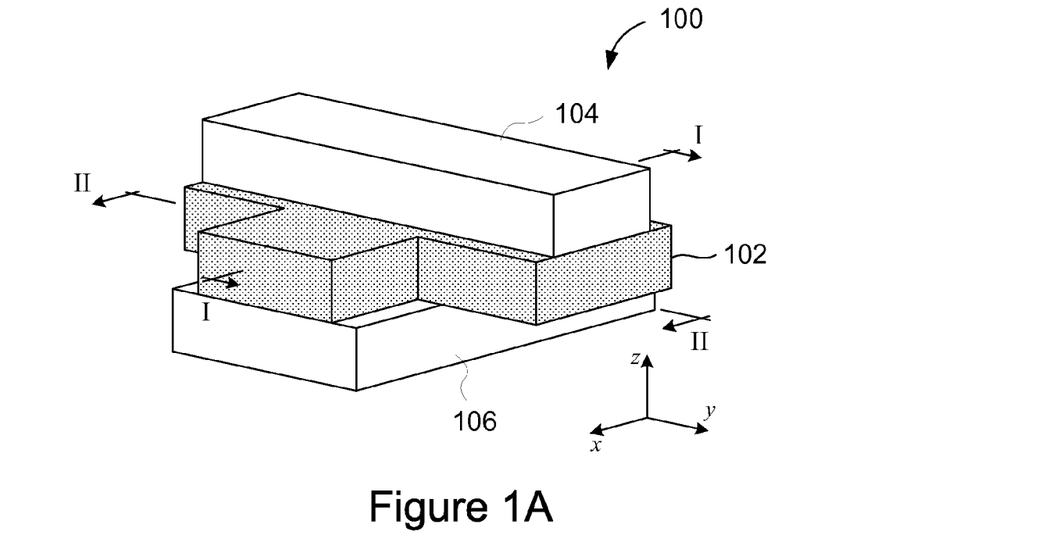
FIG. 1A shows an isometric view of a memristor device configured in accordance with embodiments of the present invention.
Figure 1B:
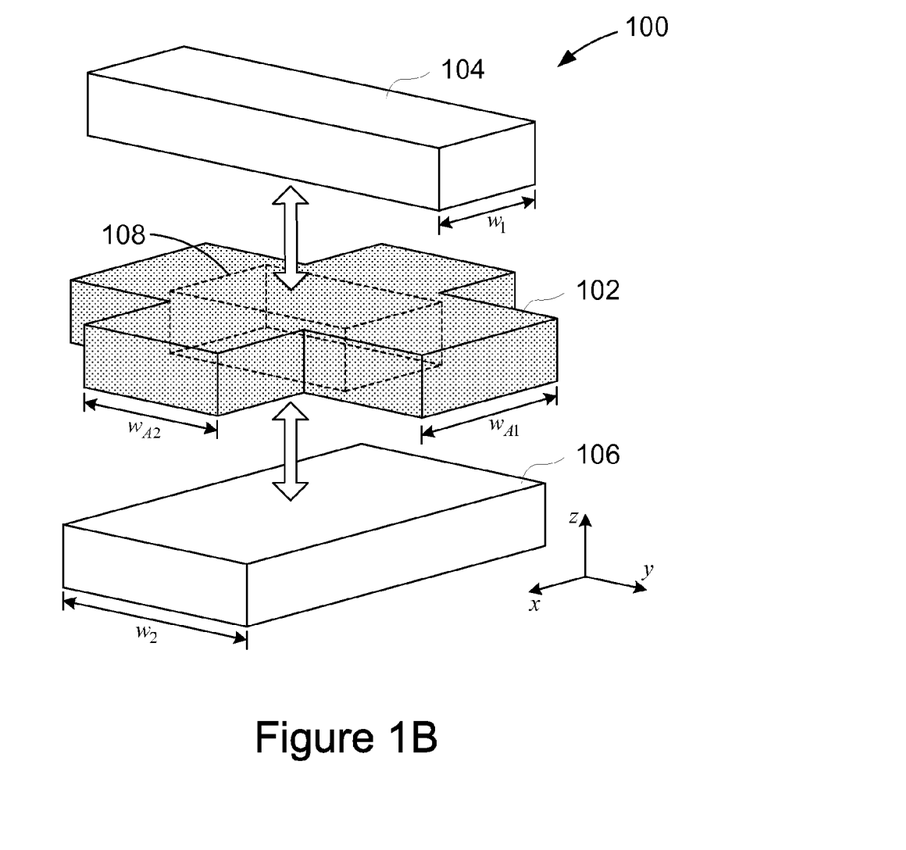
FIG. 1B shows an exploded isometric view of the memristor device, shown in FIG. 1A, in accordance with embodiments of the present invention.

FIG. 1A shows an isometric view of a memristor device 100 configured in accordance with embodiments of the present invention. As show in the example of FIG. 1A, the device 100 includes an active region 102 disposed between a first electrode 104 and a second electrode 106. FIG. 1B shows an exploded isometric view of the memristor device 100 in accordance with embodiments of the present invention. FIG. 1B reveals that in the x-direction, the width, $w_{A1}$, of the active region 102 is greater than the width of the $w_1$ of the first electrode 104, and, in the y-direction, the width, $w_{A2}$, of the active region 102 is less than the width $w_2$ of the second electrode 106. A dashed-line box 108 identifies a sub-region of the active region 102 that lies between the first electrode 104 and the second electrode 106

Figure 2A:
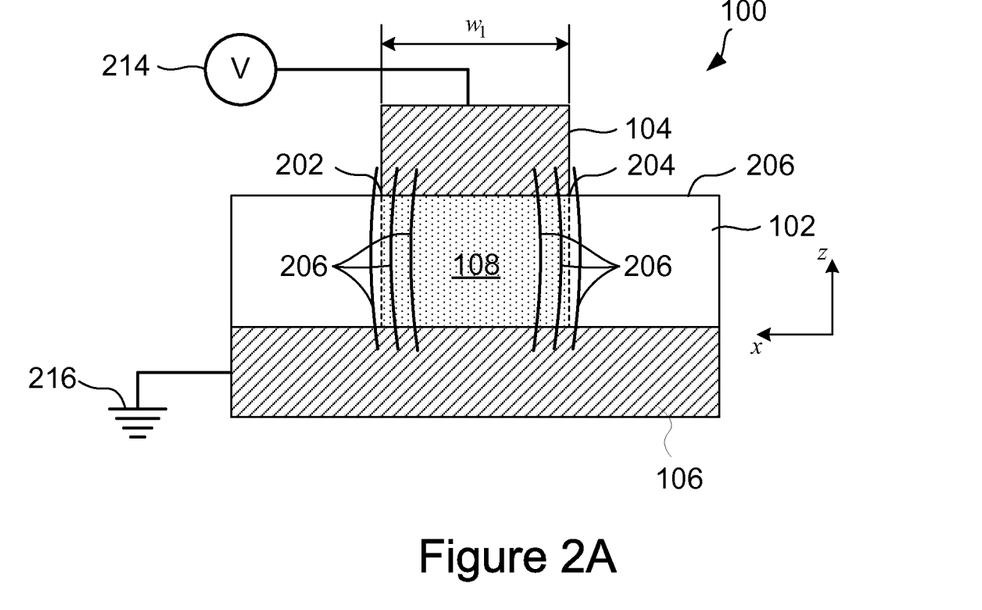
FIG. 2A shows a cross-sectional view through the center of the memristor device along a line I-I, shown in FIG. 1A, configured in accordance with embodiments of the present invention.
Figure 2B:
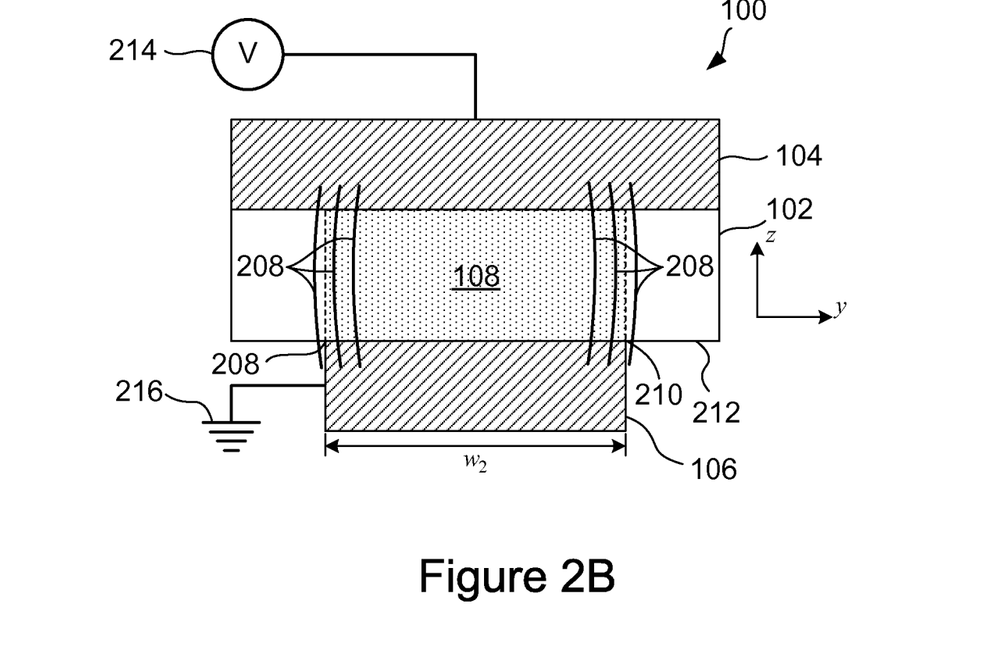
FIG. 2B shows a cross-sectional view through the center of the memristor device along a line II-II, shown in FIG. 1A, configured in accordance with embodiments of the present invention.

FIG. 2A shows a cross-sectional view through the center of the device 100 along a line I-I, shown in FIG. 1A, configured in accordance with embodiments of the present invention. FIG. 2B shows a cross-sectional view through the center of the device 100 along a line II-II shown in FIG. 1A, configured in accordance with embodiments of the present invention. FIGS. 2A and 2B reveal that the width $w_1$ of the first electrode 104 in the xz-plane is smaller than the width $w_2$ of the second electrode 106 in the yz-plane. FIG. 2A shows that edges 202 and 204 of the first electrode 104 are adjacent to a surface 206 of the active region 102. FIG. 2B also shows that edges 208 and 210 of the second electrode 102 are adjacent to a surface 212 of the active region 102. FIGS. 2A and 2B also show cross-sectional views of the sub-region 108 of the active region 102 that lies between the first electrode 104 and the second electrode 106.

FIGS. 2A and 2B also include a voltage source 214 connected to the first electrode 104 and a ground 216 connected to the second electrode 106. Applying a voltage of an appropriate magnitude creates an electric field across the active region 102, as represented by field lines 206, in FIG. 2A, and as represented by field lines 208, in FIG. 2B. As shown in FIGS. 2A and 2B, the electric field forms primarily within the sub-region 108 and can extend into a portion of the active region 102 surrounding the sub-region 108. An electric field of an appropriate magnitude can redistribute dopant concentrations in the active region 102 and, thereby, be used to set the resistance state of the active region 102 as described in greater detail below. Because the resulting electric field is typically strongest along the edges 202, 204, 208 and 210 of the electrodes where the electrodes 104 and 106 overlap, the strongest, portions of the electric field occur within the active region 102 along the sides of sub-region 108 identified by field lines 206 and 208. By concentrating the electric field within and around the sub-region 108, break down of the active region material along the exposed periphery of the active region 102 between the electrodes can be avoided.

Figure 3A:
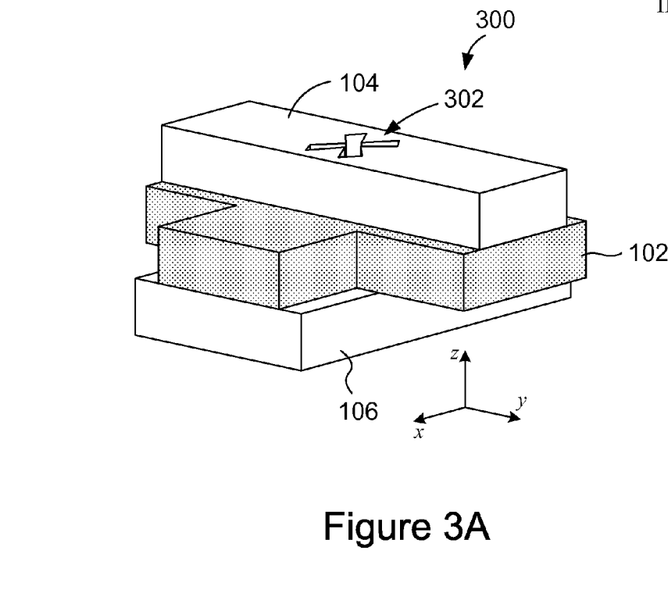
FIG. 3A shows an isometric view of a memristor device configured in accordance with embodiments of the present invention.
Figure 3B:
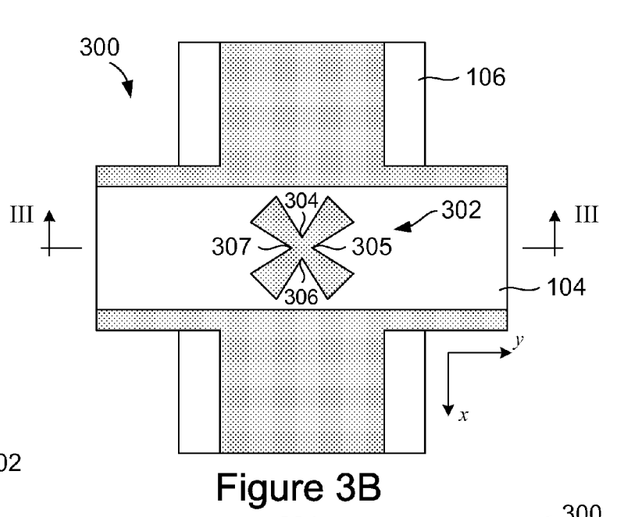
FIG. 3B shows a top plan-view of the memristor device, shown in FIG. 3A, configuration with a patterned opening in accordance with embodiments of the present invention.
Figure 3C:
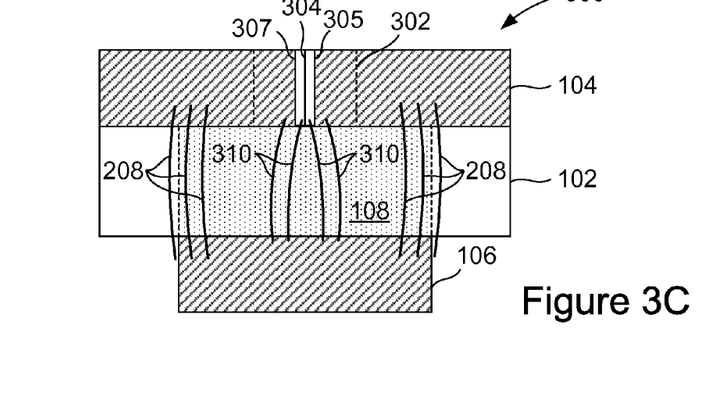
FIG. 3C shows a cross-sectional view of the memristor device along a line III-III, shown in FIG. 3B, in accordance with embodiments of the present invention.

Embodiments of the present invention include patterned openings in at least one of the electrodes 104 and 106 to concentrate the electric field over the portion of the active region 102 between the first and second electrodes 104 and 106. FIG. 3A shows an isometric view of a memristor device 300 configured in accordance with embodiments of the present invention. As shown in the example of FIG. 3A, the first electrode 104 includes a patterned opening 302 that extends the height of the first electrode 104. FIG. 3B shows a top plan-view of the device 300, shown in FIG. 3A, and reveals the configuration of the patterned opening 302 in accordance with embodiments of the present invention. The patterned opening 302 resembles a four-leaf clover and is configured to create edges above the sub-region 108, such as edges 304-307 and edges (not shown) along the first electrode 104 adjacent to the surface of the sub-region 108. FIG. 3C shows a cross-sectional view of the device 300 along a line III-III, shown in FIG. 3B, in accordance with embodiments of the present invention. As shown in the example of FIG. 3C, the edges 304, 305, and 307 are located over the sub-region 108 of the active region 102. When a voltage is applied to the first electrode, the edges 304-308 of the patterned opening 302 and edges (not shown) of the patterned opening 302 located adjacent to the sub-region 108 concentrate the electric field, represented by field lines 310, within the sub-region 108 between the electrodes 104 and 106.

Figure 4A:
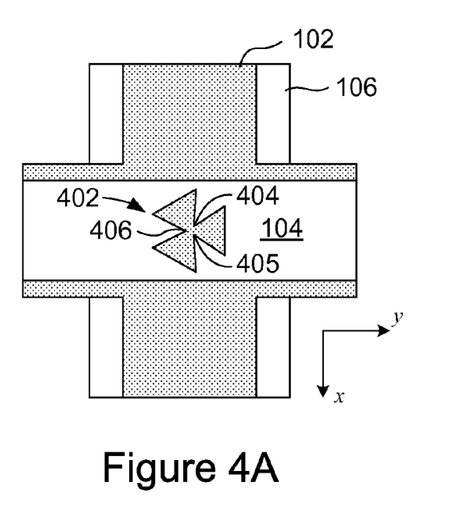
FIG. 4A shows a top plan-view of a memristor device with an electrode configured with a patterned opening in accordance with embodiments of the present invention.
Figure 4B:
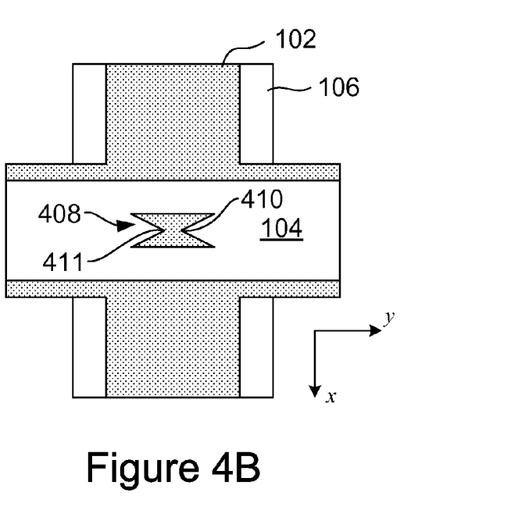
FIG. 4B shows a top plan-view of a memristor device with an electrode configured with a patterned opening in accordance with embodiments of the present invention.

Embodiments of the present invention are not limited to the four-leaf, clover-like patterned openings shown in FIG. 3. In other embodiments, the patterned opening can be configured to resemble of three-leaf clover or a two-leaf clover. FIG. 4A shows a top plan-view of the electrode 104 configured with a patterned opening 402 that creates three edges 404-406 in the first electrode 104 in accordance with embodiments of the present invention. FIG. 4B shows a top plan-view of the electrode 104 configured with a patterned opening 408 that creates two edges 410 and 411 in the first electrode 104 in accordance with embodiments of the present invention. In other embodiments, the patterned opening can have a simpler shape, such as circle, square, rectangle, ellipse, an irredular shape, or any other shape that creates edges within the electrode above the sub-region 108.

Embodiments of the present invention are also not limited to the patterned opening being formed exclusively within the first electrode 104. In other embodiments, a patterned opening can be formed in the second electrode 106. In still other embodiments, patterned openings can be formed in the first and second electrodes 104 and 106. The opening can be filled with a different material, such as a dielectric material $Si_3N_4$.

Figure 5:
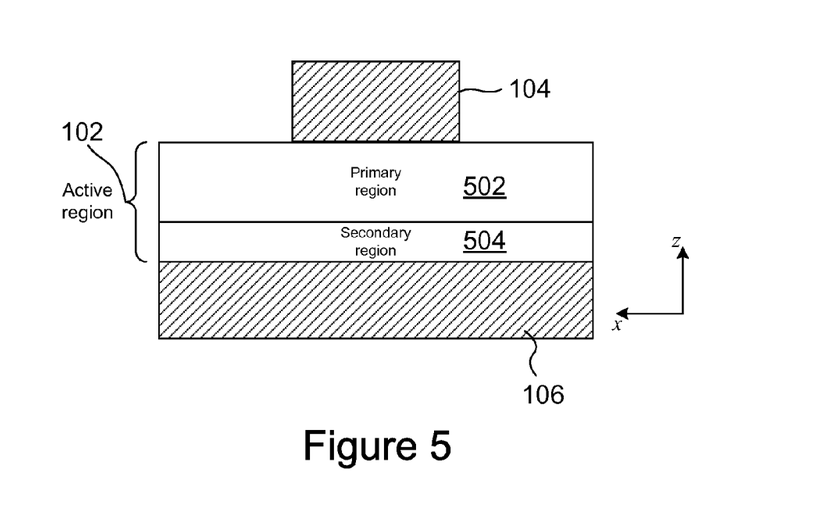
FIG. 5 shows a primary active region and a secondary active region of an active region in accordance with embodiments of the present invention.

FIG. 5 shows the active region 102 composed of a primary active region or layer 502 and a secondary active region or layer 504 in accordance with embodiments of the present invention. The primary active region 502 comprises a primary active material that is electronically semiconducting or nominally electronically insulating and can also be a weak ionic conductor. The primary active material is capable of transporting dopants that control the flow of charge carriers or current through the device 100. On the other hand, the material comprising the secondary active region 504 typically comprises a film within the active region 102 that is a source of dopants for the primary active material. These dopants may be impurity atoms that act as electron donors or electron acceptors for the primary active material. Alternatively, the dopants can be anion vacancies or cation interstitials, which in the primary active material are charged and therefore are also electron donors for the lattice of the active region 102. It is also possible to drive the anions into the primary active material, which become electron acceptors or hole donors.

The basic mode of operation of the memrisor device 100 is to apply a voltage of an appropriate magnitude to generate a corresponding electrical field of an appropriate magnitude and polarity across the active region 102, as described above with reference to FIGS. 2A, 2B and 3C. When the magnitude and polarity of the electrical field, also called a "drift field," exceeds a threshold, the dopants become mobile in the primary active material, and the dopants can drift into or out of the primary active material via ionic transport from the secondary active material. The ionic species are specifically chosen from those that act as electrical dopants for the primary active material, and thereby change the resistance of the primary active material. For example, applying a drift field that introduces dopants from the secondary active material into the primary active material lowers the resistance of the primary active material, while applying a drift field that drives dopants from the primary active material into the secondary active region 504 increases the resistance of the primary active material. In addition, the primary active material and the dopants are chosen such that the drift of the dopants into or out of the primary active material is possible hut not too facile that dopants can diffuse into or out of the primary active material when no voltage is applied. Some diffusion resistance is required to ensure that the active region 102 remains in a particular resistance state for a reasonable period of time, perhaps for many years at the operation temperature. This ensures that the active region 102 is nonvolatile because the active region 102 retains its resistance state even after the drift field has been removed. Applying a drift field with a large enough magnitude causes both electron current and dopants to drift, whereas applying operating voltages with lower relative voltage magnitudes than the drift field causes negligible dopant drill enabling the device to retain its resistance state during operation.

The memristor device 100 is a memristor because the resistance changes in a nonvolatile fashion depending on the magnitude and polarity of an electric field applied in the device 100. Memristance is a nonvolatile, charge-dependent resistance denoted by M(q). The term "memristor" is short for "memory resistor." Memristors are a class of passive circuit elements that maintain a functional relationship between the time integrals of current and voltage, or charge and flux, respectively. This results in resistance varying according to the device's memristance function. Specifically engineered memristors provide controllable resistance useful for switching current. The definition of the memristor is based solely on fundamental circuit variables, similar to the resistor, capacitor, and inductor. Unlike those more familiar elements, the necessarily nonlinear memristors may be described by any of a variety of time-varying functions. As a result, memristors do not belong to Linear Time-Independent circuit models. A linear time-independent memristor is simply a conventional resistor.

A memristor is a circuit element in which the 'magnetic flux' (defined as an integral of bias voltage over time) Φ between the terminals is a function of the amount of electric charge q that has passed through the device. Each memristor is characterized by its memristance function describing the charge-dependent rate of change of flux with charge as follows:

$$M(q) = \frac{d\Phi}{dq}$$

Based on Faraday's law of induction that magnetic flux Φ is the time integral of voltage, and charge q is the time integral of current, the memristance can be written as $$M(q) = \frac{V}{I}$$

Thus, as stated above, the memristance is simply nonvolatile charge-dependent resistance. When M(q) is constant, the memristance reduces to Ohm's Law R=VII. When M(q) is not constant, the equation is not equivalent to Ohm's Law because q and M(q) can vary with time. Solving for voltage as a function of time gives:

$$V(t)=M[q(t)]I(t)$$

This equation reveals that memristance defines a linear relationship between current and voltage, as long as charge does not vary. However, nonzero current implies instantaneously varying charge. Alternating current may reveal the linear dependence in circuit operation by inducing a measurable voltage without net charge movement, as long as the maximum change in q does not cause change in M. Furthermore, the memristor is static when no current is applied. When I(t) and V(t) are 0, M(t) is constant. This is the essence of the memory effect.

The primary active material can be single crystalline, polycrystalline, nanocrystalline, nanoporous, or amorphous. The mobility of the dopants in nanocrystalline, nanoporous or amorphous materials, however, is much higher than in bulk crystalline material, since drift can occur through grain boundaries, pores or through local structural imperfections in a nanocrystalline, nanoporous, or amorphous material. Also, because the primary active material is relatively thin, the amount of time needed for dopants to drift into or out of the primary active material enables the primary active materials conductivity to be rapidly changed. For example, the time needed for a drift process varies as the square of the distance covered, so the time to drift one nanometer is one-millionth of the time to drift one micrometer.

The primary active region 502 and the secondary active region 504 are contacted on either side by conducting/semiconducting electrodes 104 and 106, or one of the electrodes can be composed of a semiconductor material and the other a conducting material. When the active region 102 is composed of a semiconductor material, the contact between a metallic electrode and the active region 102 depletes the active region 102 of free charge carriers. Thus, the net charge of the active region 102 depends on the identity of the dopant and is positive in the case of electron donors and negative in the case of electron acceptors.

The ability of the dopant to drift in and out of the primary active material may be improved if one of the interfaces connecting the active region 102 to a metallic or semiconductor electrode is non-covalently bonded. Such an interface may be composed of a material that does not form covalent bonds with the adjacent electrode, the primary active material, or both. This non-covalently bonded interface lowers the activation energy of the atomic rearrangements that are needed for drift of the dopants in the primary active material.

One potentially useful property of the primary active material is that it can be a weak ionic conductor. The definition of a weak ionic conductor depends on the application for which the memristor device 100 is intended. The mobility $\mu_d$ and the diffusion constant D for a dopant in a lattice are related by the Einstein equation:

$$D=\mu_d kT$$

where k is Boltzmann's constant, and T is absolute temperature. Thus, if the mobility $\mu_d$ of a dopant in a lattice is high so is the diffusion constant D. In general, it is desired for the active region 102 of the device 100 to maintain a particular resistance state for an amount of time that may range from a fraction of a second to years, depending on the application. Thus, it is desired that the diffusion constant D be low enough to ensure a desired level of stability, in order to avoid inadvertently turning the active region 102 from one resistance state to another resistance state via ionized dopant diffusion, rather than by intentionally setting the state of the active region 102 with an appropriate voltage. Therefore, a weakly ionic conductor is one in which the dopant mobility $\mu_d$ and the diffusion constant D are small enough to ensure the stability or non-volatility of the active region 102 for as long as necessary under the desired conditions. On the other hand, strongly ionic conductors would have relatively larger dopant mobilities and be unstable against diffusion. Note that this relation breaks down at high field and the mobility becomes exponentialy dependent on the field.

II. Memristor Device Composition

Embodiments of the present invention are directed to memristor devices with active regions composed of various semiconductor materials in combination with a variety of different electrode compositions. These combinations of materials provide a large engineering space from which memristor devices can be fabricated, are compatible with common CMOS devices, and can be fabricated using various semiconductor fabrication techniques.

The active region 102 can be composed of an elemental and/or compound semiconductor. Elemental semiconductors include silicon (Si), germanium (Ge), and diamond (C). Compound semiconductors include group IV compound Semiconductors, III-V compound semiconductors, and II-VI compound semiconductors. Group IV compound semiconductors include combinations of elemental semiconductors, such as SiC and SiGe. III-V compound semiconductors are composed of column IIIa elements selected from boron (B), aluminum (Al), gallium (Ga), and indium (In) in combination with column Va elements selected from nitrogen (N), phosphorus (P), arsenic (As), and antimony (Sb). III-V compound semiconductors are classified according to the relative quantities of III and V elements, such as binary compound semiconductors, ternary compound semiconductors, and quaternary compound semiconductors. The active region 102 can be composed of other types of suitable compound semiconductors including II-VI ternary alloy semiconductors and II-V compound semiconductors.

The dopants in the secondary active region 504 can be p-type impurities, which are atoms that introduce vacant electronic energy levels called "holes" to the electronic hand gaps of the active region. These dopants are also called "electron acceptors." In still other embodiments, the dopants in the secondary active layer 504 can be n-type impurities, which are atoms that introduce filled electronic energy levels to the electronic band gap of the active region. These dopants are called "electron donors." For example, boron (B), Al, and Ga are p-type dopants that introduce vacant electronic energy levels near the valence band of the elemental semiconductors Si and Ge; and P, As, and Sb are n-type dopants that introduce filled electronic energy levels near the conduction band of the elemental semiconductors Si and Ge. In III-V compound semiconductors, column VI elements substitute for column V atoms in the III-V lattice and serve as n-type dopants, and column II elements substitute for column III atoms in the III-V lattice to form p-type dopants.

The primary active material can be composed of an oxide, and the second active region can be composed of a material that forms anion vacancies. The active region 102 can be Composed of oxides that contain at least one oxygen atom ("O") and at least one other element. In particular, the active region 102 can be composed of titania ("$TiO_2$"), zirconia ("$ZrO_2$"), or hafnia ("$HfO_2$"). These materials are compatible with silicon ("Si") integrated circuit technology because they do not create doping in the Si. Other composition embodiments for the active region 102 include alloys of these oxides in pairs or with all three of the elements Ti, Zr, and Hf present. For example, the active region 102 can be composed of $Ti_xZr_yHf_zO_2$, where $x+y+z=1$. Related compounds include titanates, zirconates, and hafnates. For example, titanates includes $ATiO_3$, where A represents one of the divalent elements strontium ("Sr"), barium ("Ba") calcium ("Ca"), magnesium ("Mg"), zinc ("Zn"), and cadmium ("Cd"). In general, the active region 102 can be composed of $ABO_3$, where A represents a divalent element and B represents Ti, Zr, and Hf. The active region 102 can also be composed of alloys of these various compounds, such as $Ca_aSr_bBa_cTi_xZr_yHf_zO_3$, where $a+b+c=1$ and $x+y+z=1$. There are also a wide variety of other oxides of the transition and rare earth metals with different valences that may be used, both individually and as more complex compounds. In each case, the mobile dopant is an oxygen vacancy, denoted by $V_O$. An oxygen vacancy effectively acts as a positively charged n-type dopant with one shallow and one deep energy level. Because even a relatively minor nonstoichiometry of about 0.1% oxygen vacancies in $TiO_{2-x}$ is approximately equivalent to $5 \times 10^{19}$ dopants/$cm^3$, modulating oxygen vacancy profiles have a strong effect on electron transport.

In addition to the large variety of combinations of semiconductor materials and oxides and suitable dopants comprising the active region 102, the electrodes 104 and 106 can be composed of platinum ("Pt"), gold ("Au"), copper ("Cu"), tungsten ("W"), or any other suitable metal, metallic compound (e.g. some perovskites with or without dopants such as $BaTiO_3$ and $Ba_{1-x}La_xTiO_3.PrCaMnO_3$) or semiconductor. The electrodes 104 and 106 can also be composed of metallic oxides or nitrides, such as $RuO_2$, $IrO_2$, and TiN. The electrodes 104 and 106 can also be composed of any suitable combination of these materials. For example, in certain embodiments, the first electrode 104 can be composed of Pt, and the second electrode 106 can be composed Au. In other embodiments, the first electrode 104 can be composed of Cu, and the second electrode 106 can be composed of $IrO_2$. In still other embodiments, the first electrode 104 can be composed of a suitable semiconductor, and the second electrode 106 can be composed of Pt.

III. Nonvolatile Switching of the Memristor Device

Depending on the composition of a memristor device, as described above in subsection II, the resistivity of the memristor device can be controlled in at least two different ways. For certain memristor device compositions, switching the resistance of the memristor device may be controlled at the active region/electrode interfaces in a switching process called "interface switching" described below in subsection III.A. For other memristor device compositions, the electronic barriers at the interfaces may be relatively small and contribute little to the device resistance. With these compositions, resistance switching may be performed within the bulk materials of the active region in a process called "bulk switching" described below in subsection III.B.

A. Interface Switching

In interface switching, a memristor device 100 configured as described above in subsection II can also be operated as a forward rectifier, a reverse rectifier, a shunted rectifier, or a head-to-head rectifier as described below by applying an electrical field of an appropriate magnitude and polarity across the active region 102. Nonvolatile switching between different types of rectifiers can be performed by positioning a dopant within the active region 102 to form Ohmic and Schottky barriers to control the flow of charge carriers through the active region 102. However, the traditional description of electrode/semiconductor Schottky and Ohmic barriers does not apply to a nanoscale memristor device 100 because the materials comprising the electrodes 104 and 106 and the active region 102 are structured at the nanoscale. As a result, the structural and electronic properties are not averaged over the large distances for which the theory of metal-semiconductor contacts is developed. Instead, the electronic properties of undoped electrode/active region interfaces can electronically resemble Schottky barriers and are called "Schottky-like barriers," and the electronic properties of doped electrode/active region interfaces electronically resemble Ohmic barriers and are called "Ohmic-like barriers."

Figure 6A:
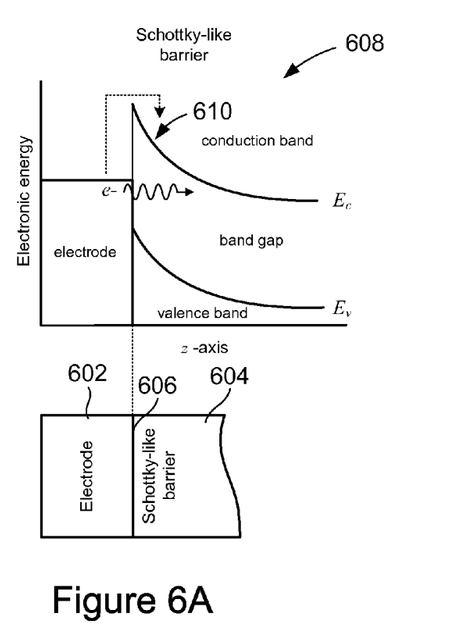
FIG. 6A shows an electronic band diagram representing electronic properties of a Schottky-like barrier at an electrode/active region interface in accordance with embodiments of the present invention.
Figure 6B:
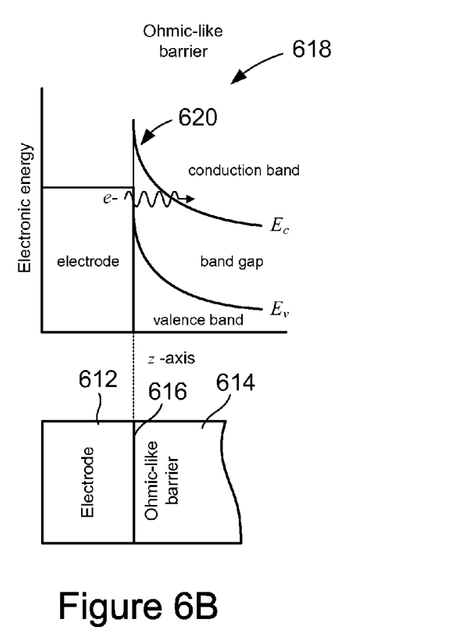
FIG. 6B shows an electronic band diagram representing electronic properties of an Ohmic-like barrier at an electrode/active region interface in accordance with embodiments of the present invention.

Dopants are selectively positioned within the active region 102 to control the flow of charge carriers through the device. In particular, conduction of electrons from an electrode into the active region 102 may occur via quantum mechanical tunneling through an Ohmic-like barrier. FIG. 6A shows an electronic band diagram that represent the electronic properties of a Schottky-like barrier at an electrode 602/active region 604 interface 606 in accordance with embodiments of the present invention. FIG. 6A includes a band diagram 608 representing variations in valence and conduction bands associated with a Schottky-like barrier. When the active region 604 near the electrode 602 has a low dopant concentration or is essentially intrinsic, the tunneling barrier is a Schottky-like barrier 610, which can be characterized as high and wide, effectively preventing electrons from readily tunneling into the conduction band of the active region 604, although, as shown in FIG. 6A, some electrons may enough thermal energy to excede the barrier and reach the conduction band. Thus, the conductivity through the active region 604 is low and the memristor device 100 is said to be in an "off" state. On the other hand, FIG. 6B shows an electronic band diagram that represent the electronic properties of an Ohmic-like barrier at an interface 616 in accordance with embodiments of the present invention. FIG. 6B includes a band diagram 618 representing variations in valence and conduction bands associated with an Ohmic-like barrier in accordance with embodiments of the present invention. Band diagram 618 represents the case where a sufficient number of dopants have been moved into the active region 614 near the electrode 612. As a result, the tunneling barrier is an Ohmic-like barrier 620 and the width and perhaps the height of the tunneling barrier are diminished such that electrons can tunnel from the electrode 612 into the conduction band of the active region 614, which results in an increase in conductivity, and the device 100 is said to be in an "on" state.

Figure 7:
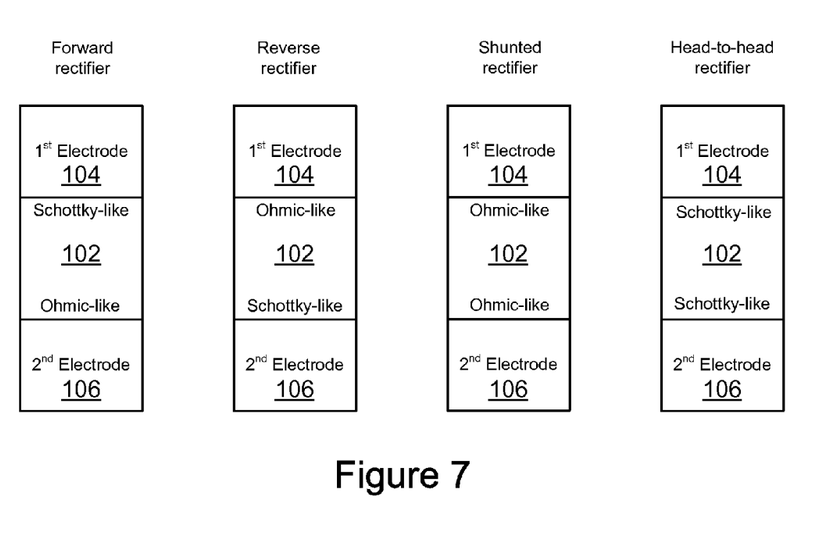
FIG. 7 shows the relative locations of Ohmic-like and Schottky-like barriers associated with four rectifiers formed in a homostructure active region of a memristor device in accordance with embodiments of the present invention.

FIG. 7 shows the relative locations of Ohmic-like and Schottky-like barriers associated with each of four rectifiers that can be formed in a homostructure active region of a memristor device in accordance with embodiments of the present invention. A forward rectifier 701 and a reverse rectifier 702 have Ohmic-like barriers and Schottky-like, barriers located at opposite interfaces. A shunted rectifier 703 is characterized by having dopants located at or near both interfaces creating Ohmic-like barriers at both interfaces. On the other hand, a head-to-head rectifier 704 is characterized by having the dopants distributed within the active region 102 leaving Schottky-like barriers at both interfaces. Each of the four rectifiers represents a different distribution of dopants. Application of voltages with an appropriate polarity and magnitude can be used to move the dopants and switch the memristor device between the different rectifiers. The memristor device can then be operated as a particular rectifier by applying voltages that do not exceed the voltage threshold used to switch the rectifier state.

Figure 8:
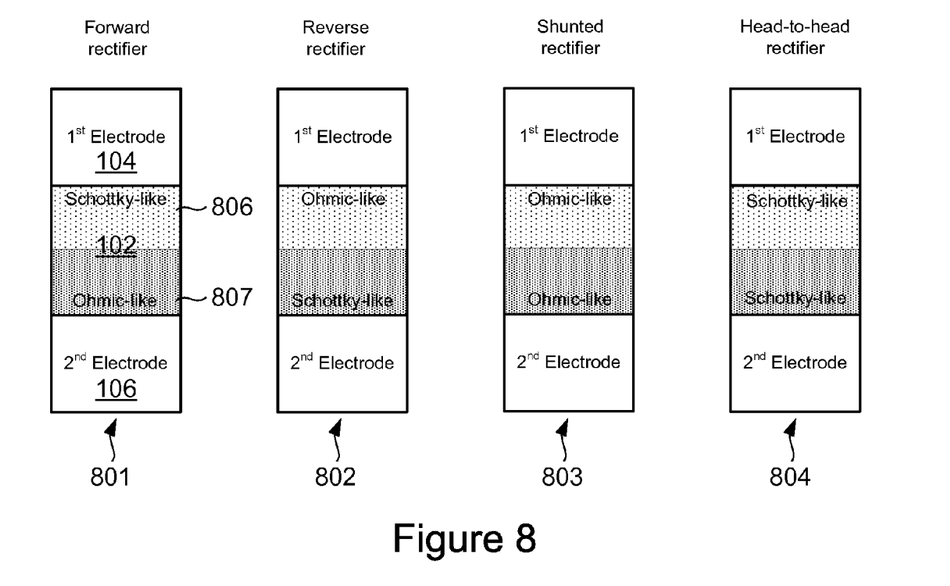
FIG. 8 shows the relative locations of the Ohmic-like and Schottky-like barriers associated four rectifiers formed in a heterostructure active region of a memristor device in accordance with embodiments of the present invention.

The semiconductor materials can be selected to form heterostructure active regions and electrodes providing a large engineering space from which memristor devices can be fabricated. FIG. 8 shows the relative locations of the Ohmic-like and Schottky-like barriers associated with each of the four rectifiers 801-804 in a memristor device with a heterostructure active region of a memristor device in accordance with embodiments of the present invention. Lightly shaded region 806 represents a first semiconductor layer composed of a first semiconductor material and darkly shaded region 807 represents a second semiconductor layer composed of a second semiconductor material. Unlike the rectifiers, described above with reference to FIG. 7, the different semiconductor materials have different Schottky-like and Ohmic-like barriers with metallic electrodes. For example, the Ohmic-like barrier 807 of the forward rectifier 801 may be higher and wider than the Ohmic-like barrier 808 of the reverse rectifier 802. The Schottky-like harrier 809 of the reverse rectifier 802 may be higher and wider than the Schottky-like barrier 806 of the forward rectifier 801. In addition, the Ohmic-like barrier 810 can be higher and wider than the Ohmic-like barrier 811. Finally, the two Schottky-like barriers 812 may be higher and wider than the Schottky-like barrier 813. Heterojunctions formed between different semiconductor layers of an active region can also affect the flow of charge carriers through a memristor device. The semiconductor materials forming a heterojunction typically have unequal band gaps, and the semiconductor materials can be selected to form different types of heterojunctions.

B. Bulk Switching

Figure 9:
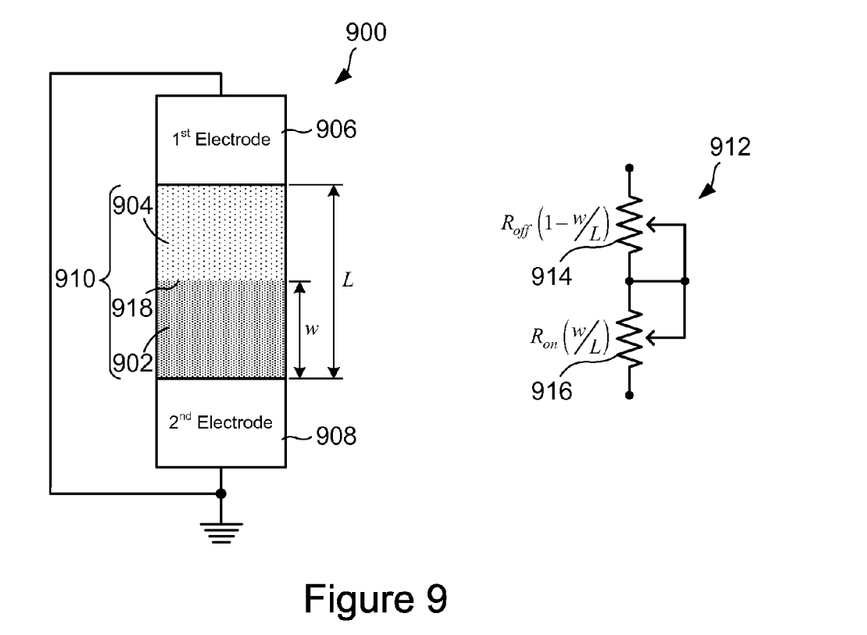
FIG. 9 shows a schematic representation of a memristor device used in bulk switching and configured in accordance with embodiments of the present invention.

Unlike interface switching, in bulk switching, there is no, or relatively little, electronic barrier at the active region/electrode interface. In other words, interface resistance is negligible and bulk resistance dominates. Embodiments of the present invention include selecting the semiconductor and dopant materials for the active region in order to form an active resistor with two sub-regions, each sub-region having a different resistance in series. FIG. 9 shows a schematic representation of a memristor device 900 used in bulk switching and configured in accordance with embodiments of the present invention. The device 900 includes a doped semiconductor region 902 and a substantially undoped semiconductor region 904. The regions 902 and 904 are sandwiched between a first electrode 906 and a second electrode 908 and form an active region 910 that can be composed of a single semiconductor or a combination of two or more semiconductor layers, as described above in subsection II. The thickness of the active region 910 is denoted by L and w is a state variable that specifies the distribution of dopants in the active region 910. It is proposed that resistance switching and charge transport within the device 900 is a hysteresis requiring an atomic rearrangement of dopants with the active region 910 that modulates the electronic current. The total resistance of the device 900 is determined by two variable resistors connected in series, where the resistances are given for the full length L of the device 900. In particular, the doped region 902 has a relatively low resistance $R_{on}$, and because the region 904 has a low or substantially zero dopant concentration, the region 904 has a relatively higher resistance $R_{off}$. FIG. 9 also includes a circuit diagram 912 with a first resistor 914 and a second resistor 916 in series. First resistor 914 represents the substantially undoped region 904 and has a relatively higher resistance than the second resistor 916 representing the doped region 902.

Application of an external bias voltage v(t) across the device 900 moves the boundary 918 between the two regions 902 and 904 by causing the charged dopants to drift into the undoped region 904. For example, in the case of Ohmic electronic conduction and linear ionic drift in a uniform field with average ion mobility $\mu_V$ gives:

$$v(t) = \left(R_{on}\frac{w(t)}{L} + R_{off}\left(1 - \frac{w(t)}{L}\right)\right)i(t)$$

and $$\frac{dw(t)}{dt} = \mu_V \frac{R_{on}}{L} i(t)$$

which yields the following:

$$w(t) = \mu_V \frac{R_{on}}{L} q(t)$$

where w ranges from 0 to L. Substituting w(t) into v(t) and taking $R_{off} \Box R_{off}$ gives:

$$M(q) = R_{off}\left(1 - \frac{\mu_V R_{on}}{L^2} q(t)\right)$$

The time-dependent charge q (t) is the contribution to the memristance and it becomes larger in absolute value for relatively higher dopant mobilities $\mu_V$ and smaller L. In particular, for any material, q(t) pre-factor is approximately 1,000,000 times larger in absolute value at the nanometer scale, because of the factor $1/L^2$, and the memristance is correspondingly more significant. Thus, memristance becomes more important for understanding the electronic characteristics of any device 900 as the dimensions shrink to the nanometer scale.

Figure 10:
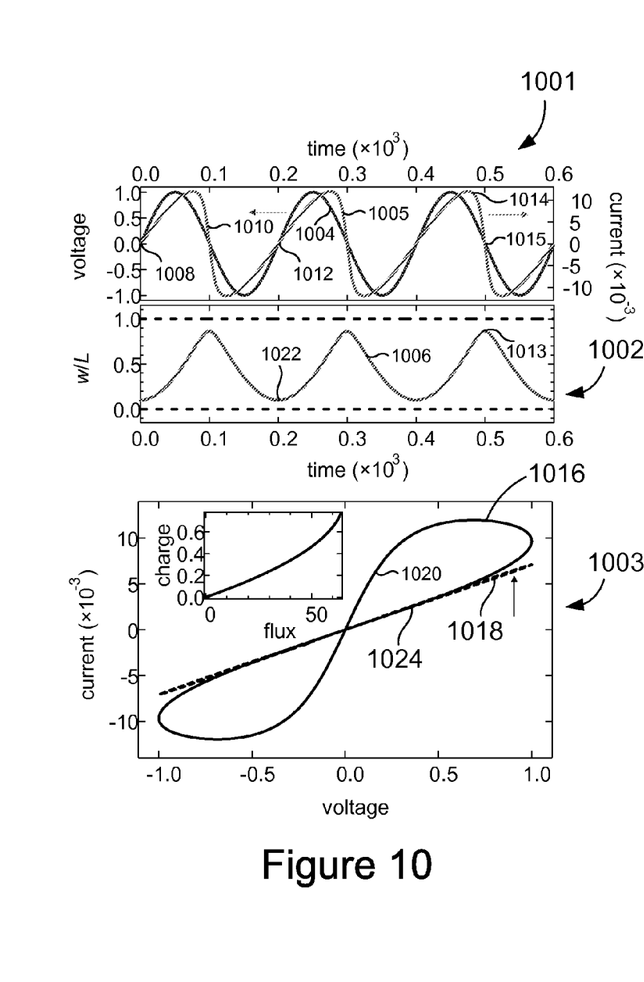
FIG. 10 shows plots of a first applied voltage, resulting current, and I-V hysteresis for a memristor device operated in accordance with embodiments of the present invention.

The state variable w is proportional to the charge q that passes through the device 900 until its value approaches L. This is the condition of "hard" switching characterized by large voltage excursions or long times under bias voltage. FIG. 10 shows a first plot 1001 of an applied voltage and resulting current versus time, a second plot 1002 of the ratio of w/L versus time, and a plot 1003 of I-V hysteresis for the device 900 operated in accordance with embodiments of the present invention. In plot 1001, an applied voltage curve 1004, representing $v_0 \sin(\omega_0 t)$, represents an oscillating bias voltage applied the device 900 where $v_0$ is the magnitude of the applied bias voltage and $\omega_0$ is the frequency, and curve 1005 represents the resulting current flowing through the device 900 with a resistance ratio $R_{on}/R_{off}=160$. In plots 1001-1003, the axes are dimensionless, with voltage, current, time, flux, and charge expressed in units of $v_0=1V$, $i_0=v_0/R_{on}=10$ mA, $t_0=2\pi/\omega_0=L^2/\mu_V v_0=10$ ms, where $i_0$ denotes the maximum possible current through the device 900, and to is the shortest time required for linear drift of dopants across the full device 900 length in a uniform field $v_0/L$, for example with L=10 nm and $\mu_V=10^{-10}$ cm$^2$s$^{-1}$V$^{-1}$.

Plots 1001 and 1002 reveal how the ratio w/L 1006 and the resulting current 1005 flowing through the device 900 respond to the oscillating applied bias voltage 1004. For example, while the applied voltage is positive, such as between point 1008 and 1010, w/L curve 1006 reveals that w increases. In other words, the doped region 902 expands because an electric field associated with the applied voltage causes dopants to drift into the shrinking undoped region 904. In contrast, when the polarity of the applied voltage reverses between point 1010 and 1012, the doped region 902 retracts because the field associated with the reverse polarity causes dopants to drift in the opposite direction expanding the undoped region 904. Curves 1005 and 1006 reveal how the amplitude of the current flowing through the device 900 changes with w. For example, current curve 1005 reveals that as the resulting current approaches a maximum amplitude (negative or positive), such as point 1014, w is approaching a maximum, such as point 1013, and the current goes to zero, as indicated by point 1015, when w reaches the maximum at point 1013. Note that, for the parameters selected, the applied bias never forces either of the two resistive regions to collapse. For example, curve 1006 shows that w/L does not approach zero or one. Plot 1003 shows two I-V hysteresis curves 1016 and 1018. Relatively steep positively sloped portion 1020 of curve 1016 corresponds to minima, such as minimum 1022, of x/L curve 1006, and gentle, positively sloped portion 1024 corresponds to maxima, such as maximum 1012, of x/L curve 1006. As long as the device 900 remains in the memristor regime, any symmetrical alternating-current voltage bias results in double-loop I-V hysteresis that collapses to a straight line for high frequencies. In particular, the collapsed I-V hysteresis identified by straight line 1018 is observed for a 10 fold increase in the frequency of the applied bias voltage.

Figure 11:
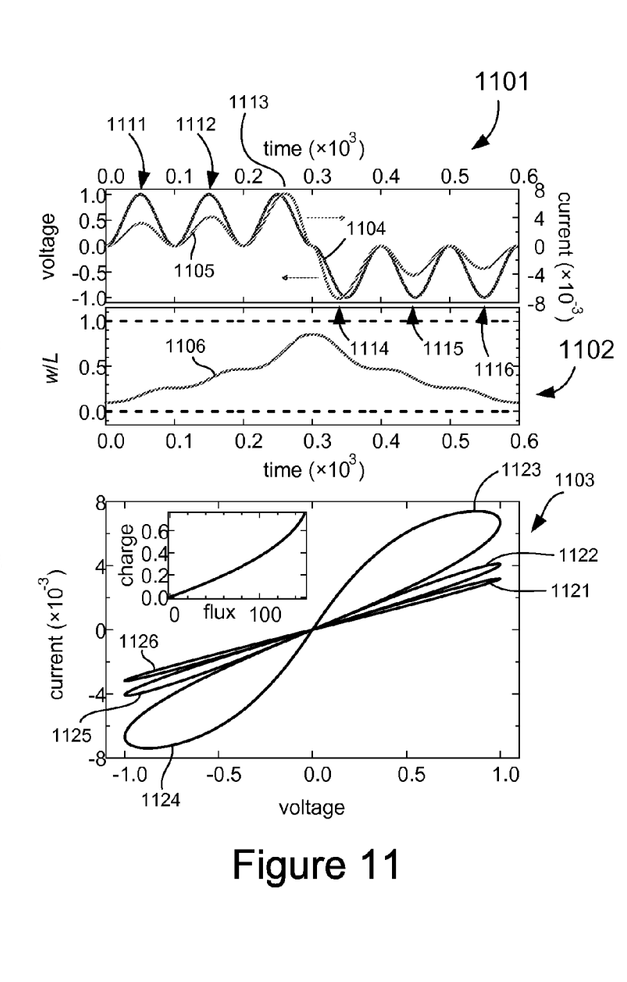
FIG. 11 shows plots of a second applied voltage, resulting current, and I-V hysteresis for a memristor device operated in accordance with embodiments of the present invention.

FIG. 11 shows a first plot 1101 of an applied voltage and resulting current versus time, a second plot 1102 of the ratio of w/L versus time, and a plot 1103 of I-V hysteresis for the device 1100 operated in accordance with embodiments of the present invention. In plot 1101, an applied voltage curve 1104 is $\pm v_0 \sin^2(\omega_0 t)$, and curve 1005 represents the resulting current flowing through the device 1100 with a resistance ratio $R_{on}/R_{off}=380$. The axes are also dimensionless with voltage, current, time, flux, and charge characterized as described above with reference to FIG. 10. Curve 1106 represents the ratio of w/L associated with curves 1104 and 1105. Successive waves 1111-1116 correspond to loops 1121-1126 of I-V hysteresis curves, shown in plot 1103, indicate that multiple continuous states are obtained when there is any sort of asymmetry in the applied bias.

IV. Nanowire Implementations

Figure 12:
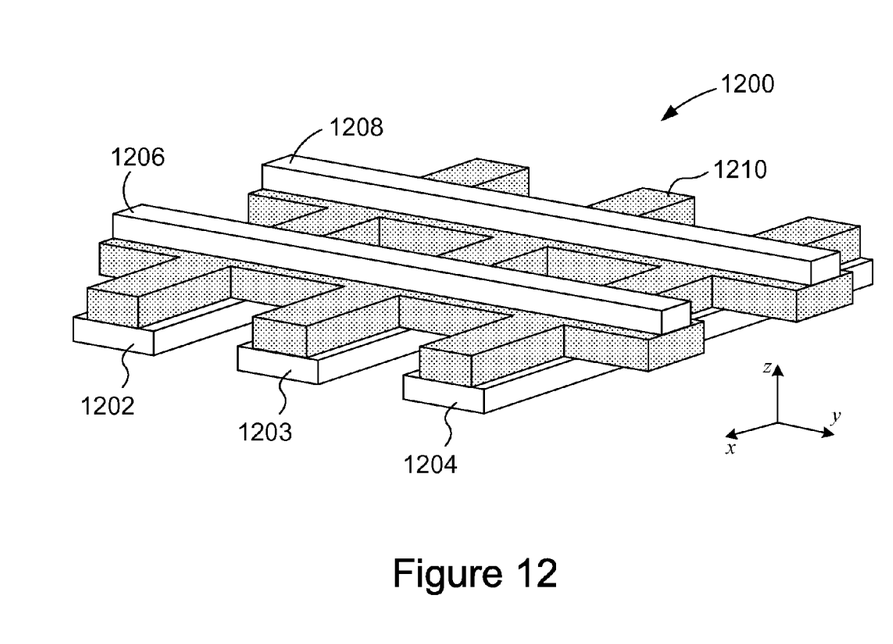
FIG. 12 shows an isometric view of a nanowire crossbar array configured in accordance with embodiments of the present invention.

The memristor devices described above in subsections I-III can be implemented at nanowire intersections of nanowire crossbar arrays. FIG. 12 shows an isometric view of a nanowire crossbar array 1200 configured in accordance with embodiments of the present invention. The crossbar array 1200 is composed of a first layer of approximately parallel nanowires 1202-1204 that are overlain by a second layer of approximately parallel nanowires 1206 and 1208. The nanowires 1202-1204 are approximately perpendicular, in orientation, to the nanowires 1206 and 1208, although the orientation angle between the layers may vary. Although individual nanowires in FIG. 12 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires.

The two layers of nanowires form a lattice, or crossbar, with each of the nanowires 1206 and 1208 overlying the nanowires 1202-1203 and coming into close contact at nanowire intersections that represent the closest contact between two nanowires. As shown in FIG. 12, the crossbar array includes an intermediate layer 1210 composed of the active region materials described above in subsection II forming an active region at each nanowire intersection. In other words, each nanowire intersection is configured as a memristor device described above in subsections I and III.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A memristor device, comprising:
   an active region comprising a primary active region and a secondary active region, wherein the secondary active region is a source of dopants for the primary active region;
   a first electrode disposed on a first surface of the active region, the first electrode configured with a smaller width than the active region in a first direction; and
   a second electrode disposed on a second surface of the active region, the second surface opposite the first surface and the second electrode configured with a larger width than the active region in a second direction, wherein application of a voltage to at least one of the electrodes produces an electric field across a sub-region within the active region between the first electrode and the second electrode; and
   a patterned opening in at least one of the electrodes, the patterned opening concentrating the electric field within the sub-region.

2. The memristor of claim 1 wherein the first direction is substantially orthogonal to the second direction.

3. The memristor of claim 1 wherein the patterned opening further comprises one or more edges.

4. The memristor of claim 1 wherein the patterned opening further comprises one of: a clover-like configuration, a circle, a square, a rectangle, an ellipse, an irregular shape.

5. The memristor of claim 1 wherein the first electrode and the second electrode are selected from a group consisting of platinum, aluminum, gold, silver, copper, tungsten, or any other suitable metal, metallic compound or semiconductor.

6. The memristor of claim 1 wherein the width of the first electrode in the first direction is smaller than the width of the second electrode in the second direction.

7. The memristor of claim 1 wherein the patterned opening is filled with a different material then a corresponding electrode.

8. The memristor of claim 7 wherein the different material is a dielectric material.

9. The memristor of claim 1 in which edges of the first electrode are adjacent to a surface of the active region.

10. The memristor of claim 1 in which edges of the second electrode are adjacent to a surface of the active region.

11. The memristor of claim 1 in which the memristor is part of a crossbar array.

12. A crossbar comprising:
    a first layer of substantially parallel nanowires;
    a second layer of substantially parallel nanowires overlaying the first layer of nanowires;
    at least one nanowire intersection forming a memristor device, each memristor device including an active region disposed between a nanowire in the first layer and a second nanowire in the second layer, wherein the nanowire in the second layer is configured with a larger width than the active region in a first direction and the nanowire in the first layer is configured with a smaller width than the active region in a second direction, wherein application of a voltage to at least one of the first and second nanowires produces an electric field across a sub-region within the active region between the first electrode and the second electrode; and
    a patterned opening in at least one of the nanowires at a nanowire intersection, the patterned opening concentrating the electric field within the sub-region.

13. The memristor of claim 12 wherein the nanowires in the first layer are approximately perpendicular, in orientation, to the nanowires in the second layer.

14. The memristor of claim 12 wherein the patterned opening further comprises one or more edges.

15. The memristor of claim 12 wherein the patterned opening further comprises one of: a clover-like configuration, a circle, a square, a rectangle, an ellipse, or an irregular shape.

16. The memristor of claim 12 wherein the active region further comprises a primary active region and a secondary active region, wherein the secondary active region is a source of dopants for the primary active region.

17. The memristor of claim 12 wherein the nanowires in the first layer and the nanowires in the second layer are composed of materials selected from a group consisting of platinum, aluminum, gold, silver, copper, tungsten, or any other suitable metal, metallic compound or semiconductor.

18. The memristor of claim 12 in which the patterned opening is formed in a nanowire of the first layer and a nanowire of the second layer that intersect one another.

19. A memristor device, comprising:
    an active region having a primary active layer and a secondary active layer, wherein the secondary active layer is a source of dopants for the primary active layer;
    a first electrode disposed on a first surface of the active region, the first electrode configured with a smaller width than the active region in a first direction; and
    a second electrode disposed on a second surface of the active region, the second surface opposite the first surface and the second electrode configured with a larger width than the active region in a second direction, wherein application of a voltage to at least one of the electrodes produces an electric field across a sub-region within the active region between the first electrode and the second electrode;
    a first patterned opening in the first electrode; and
    a second patterned opening in the second electrode.

* * * * *